United States Patent
Schroeder

(10) Patent No.: US 7,157,194 B2
(45) Date of Patent: Jan. 2, 2007

(54) METHOD FOR EXPOSING A SUBSTRATE WITH A STRUCTURE PATTERN WHICH COMPENSATES FOR THE OPTICAL PROXIMITY EFFECT

(75) Inventor: Uwe Paul Schroeder, Langebrück (DE)

(73) Assignee: Infineon Technologies AG, Munich (DE)

( * ) Notice: Subject to any disclaimer, the term of this patent is extended or adjusted under 35 U.S.C. 154(b) by 504 days.

(21) Appl. No.: 10/771,302

(22) Filed: Feb. 5, 2004

(65) Prior Publication Data

US 2006/0024594 A1    Feb. 2, 2006

(30) Foreign Application Priority Data

Feb. 5, 2003    (DE) ................................ 103 04 674

(51) Int. Cl.
*G03F 9/00*    (2006.01)

(52) U.S. Cl. ............................................ 430/30; 430/5

(58) Field of Classification Search .................... 430/5, 430/30; 716/8, 9, 19
See application file for complete search history.

(56) References Cited

U.S. PATENT DOCUMENTS 5,698,346 A    12/1997    Sugawara

*Primary Examiner*—Christopher G. Young
(74) *Attorney, Agent, or Firm*—Edell, Shapiro & Finnan, LLC

(57) ABSTRACT

In a circuit layout, a partial area is defined in a first structure pattern, which is stored electronically in a data format and represents a first lithographic plane, in which partial area a lower limit value for the length of a serif to be added to a structure element in an OPC correction can be undershot in order to locally increase the resolution. The partial area in the electronically stored circuit layout maybe, for example, an active region with which contact is to be made and which has been selected in a second structure pattern of a further lithographic plane as a structure element. Thus, within such a partial area of an integrated circuit, elevated requirements made of dimensionally accurate imaging are satisfied, while the required data volume overall increases only to an insignificant extent.

6 Claims, 2 Drawing Sheets

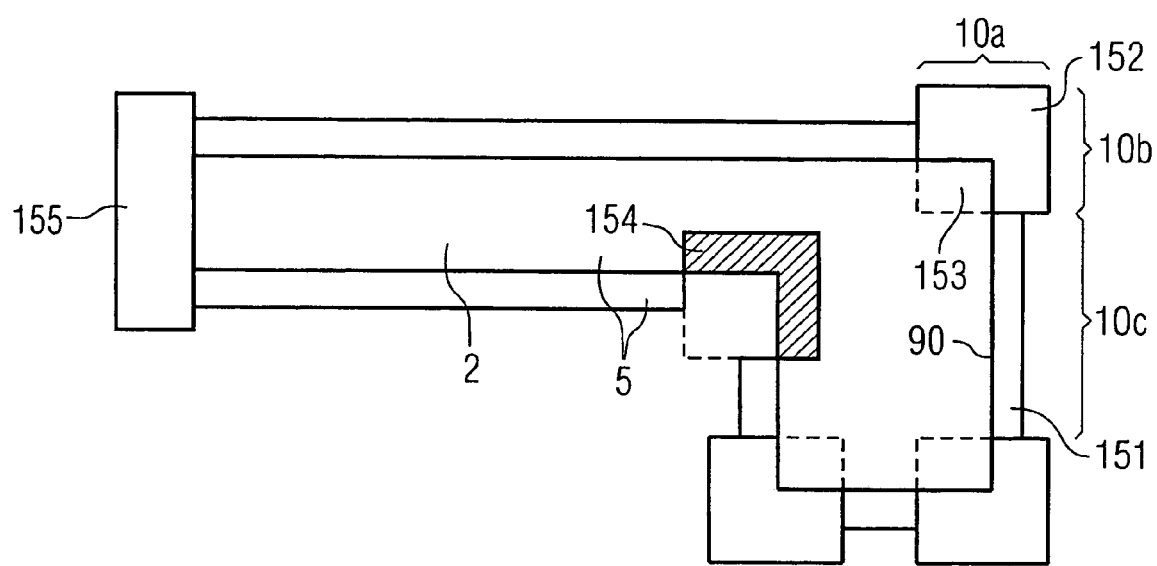

Figure 1:
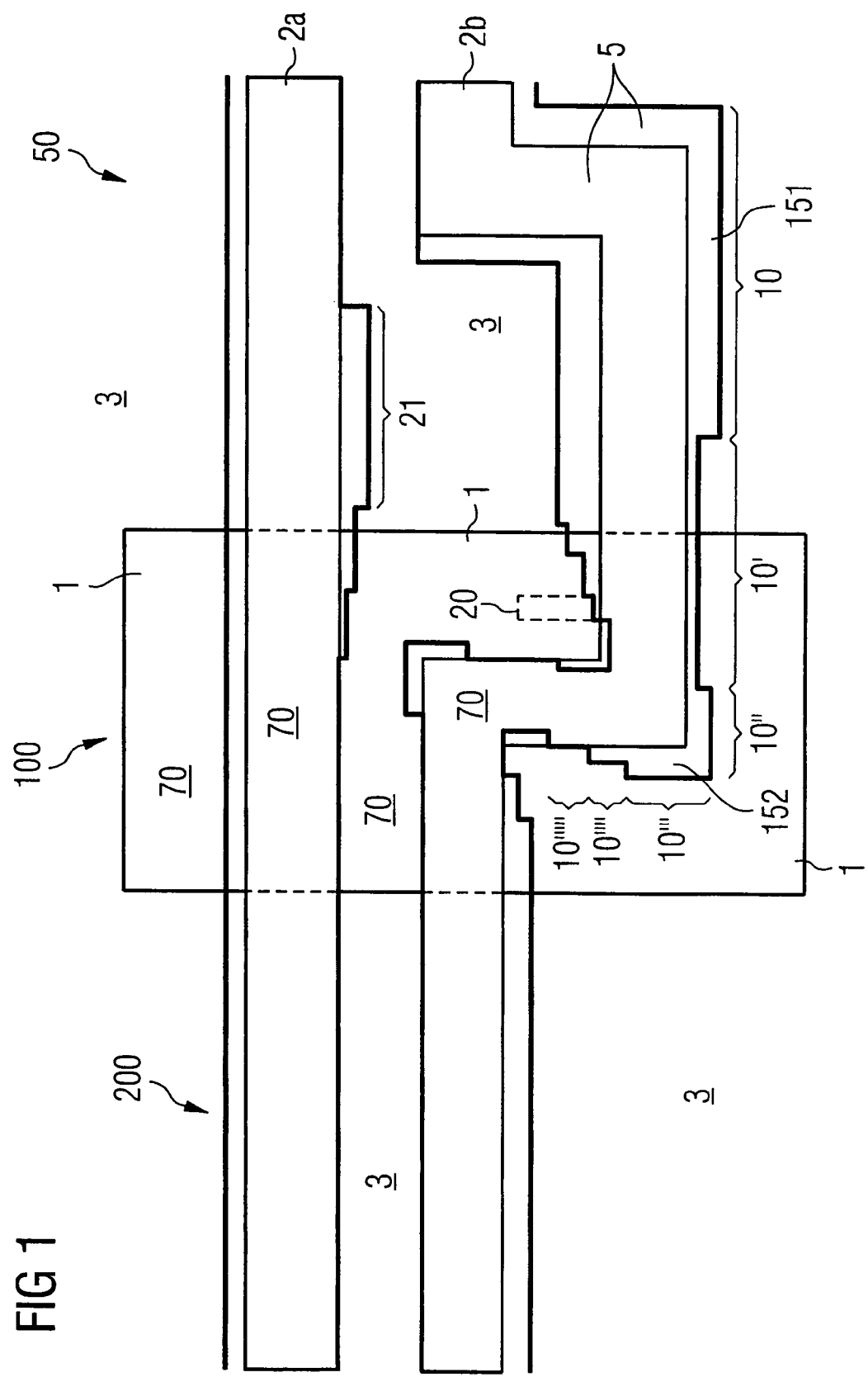

METHOD FOR EXPOSING A SUBSTRATE WITH A STRUCTURE PATTERN WHICH COMPENSATES FOR THE OPTICAL PROXIMITY EFFECT

CROSS-REFERENCE TO RELATED APPLICATION

This application claims priority under 35 USC §119 to German Application No. DE 10304674.7, filed on Feb. 5, 2003, and titled "Method for Exposing a Substrate with a Structure Pattern Which Compensates for the Optical Proximity Effect, the entire contents of which are hereby incorporated by reference.

FIELD OF THE INVENTION

The invention relates to a method for exposing a substrate with application of correction of the optical proximity effect for the imaging of a structure pattern stored electronically in a data format, such as GDS II, for example, on a substrate, in particular a semiconductor wafer.

BACKGROUND

Integrated circuits are fabricated by a series of successive exposure steps with projection in each case of structure patterns arranged on masks into a resist arranged on a substrate. In this case, it is endeavored to form structure patterns on the substrate whose structure elements have the smallest possible lateral dimensions in order, for example, to shorten the timing clock cycles of the integrated circuits with the aim of improving performance and in order to achieve a larger number of circuits per basic area with the aim of saving costs.

However, a lower resolution limit is imposed on the lateral dimensions due to the wavelength of the light used during the lithographic projection and also due to the numerical aperture of the exposure system. Integrated circuits having a high packing density, such as memory products, for instance, are therefore fabricated with lateral dimensions just above this resolution limit.

In this case, the problem arises that, on account of proximity effects, although the structure elements are transferred to the substrate from a mask, the lateral dimensions, respectively, achieved are not reproduced dimensionally accurately on the substrate. One reason for these proximity effects is to be found in lens imperfections, for example. However, a varying resist thickness or a varying topography on the semiconductor substrates may also cause these effects. In addition, so-called micro-loading on account of interactions between chemically active regions, light scattering and reflections are also taken into consideration as causes.

The proximity effects are manifested, for example, in a shortening of the ends of long narrow lines (line shortening), a rounding of line corners envisaged as rectangular in the design, or a narrowing or widening of narrow lines.

One solution to the problem is to compensate for the action of the optical proximity effects by taking account of biases in the design data, i.e., the circuit plans. Such a method is known by the term Optical Proximity Correction (OPC). The biases are set up in such a way that, under the influence of the proximity effects during the projection step, the structure pattern originally provided in the electronically stored circuit layout is actually produced on the substrate.

Higher positional accuracies of, for example, two metal planes, which are patterned one above the other and make contact with one another, are thus achieved with the aid of the OPC method, thereby ensuring a reliable functionality of the integrated circuit to be produced.

Circuit plans are usually present in easily transferable electronic data formats, for example, the GDS II format. In this case, the structure elements stored therein are subdivided hierarchically in planes corresponding to the structure patterns to be formed on the masks. Only a circuit layout comprising a plurality of planes defines the complete integrated circuit. The circuit plans present in such a data format comprise an assignment of structure elements to absolute or relative position coordinates.

The position coordinates are specified in a coordinate grid with a minimum grid size. A smaller grid size, i.e., a narrower coordinate grid enables a higher resolution of structures in the circuit plans. On account of the increasing number of possible grid points, the complexity for the memory space also increases. In particular, the computational complexity for carrying out the OPC method also increases. Data handling, transmission and error checking, etc. thus reach a critical limit.

OPC design software used at the present time attains a data volume up to an order of magnitude of 1 terabyte. Consequently, there is a narrow leeway between the data accuracy to be obtained and feasible technical complexity for carrying out the optical proximity correction.

SUMMARY

The object of the present invention is to achieve a high resolution in the correction data, while the required data volume is kept comparatively low.

A method for exposing a substrate with correction of the optical proximity effect can include:

providing a circuit layout representing an integrated circuit to be formed on the substrate, creating a first and at least one second structure pattern in the circuit layout, which in each case have an assignment of structure elements to positions within a common idealized basic area, electronically storing the first arid at least the second structure pattern in a data format, prescribing a lower limit value for a length of a serif, which, in order to compensate for the optical proximity effect, is to be added to a segment of an outer side of one of the structure elements in the electronically stored first structure pattern, defining a partial area of the idealized basic area, which comprises at least one selected structure element of the second structure pattern stored electronically in the data format, selecting a segment of an outer side of at least one first structure element of the first structure pattern stored electronically in the data format, the segment having a position within the idealized basic area, comparing the position of the segment in the electronically stored first structure pattern with the partial area, determining a length of a serif in a manner dependent on the comparison result, so that the length is less than the lower limit value, adding the serif to the segment of the outer side of the first structure element in the data format in order to form a first structure pattern which compensates for the optical proximity effect, exposing a mask with the compensated first structure pattern, and transferring and exposing the first structure pattern from the mask to the substrate with correction of the optical proximity effect.

A reduction of the data volume in the data format representing the circuit layout is achieved by virtue of the fact that high resolutions, for the application of the OPC corrections, i.e., in order to compensate for the optical proximity effect, require partial areas defined only according to particular standpoints in the circuit layout. These partial areas correspond, for example, to those regions of a lithographic plane in which a high degree of absolute or relative positional accuracy must be achieved.

An important criterion for defining such a partial area may be, for example, a selected, second structure element of another plane, that is, a second structure pattern of the circuit layout, with which contact is to be made with high precision by structure elements of the first plane currently under consideration, that is, the first structure pattern.

A resulting overlap area of the contact between two planes determines, for example, the magnitude of the nonreactive resistance in the integrated circuit on the substrate, if a line contact is involved. The resistance generally lies within prescribed tolerances. According to the present invention, the partial area may, for example, be defined to be equal to the overlap area.

A further example is the definition of the channel width of a transistor by the definition of the partial area in the data format. In this case, the first structure element of the current, first structure pattern represents a gate terminal, whereas a second structure element of the second structure pattern of another plane represents an active region.

The implementation of the OPC correction is described, according to the present invention, by adding serifs to side segments of structure elements of the original circuit layout. The term serif encompasses the formation of hammerheads or line biases. The present invention also encompasses the subtraction of serifs from the existing structure elements of a structure pattern.

Essentially two types of OPC methods have developed in the area of OPC methodology, and they will be described briefly below:

1. The model-based OPC, in which a mathematical model is created, which simulates the aerial images resulting from proximity effects, i.e., images of the original structure patterns on a substrate. Data gathered experimentally are in this case incorporated into the calculations. What are found as a result are the necessary corrections with respect to the individual structure elements of the structure pattern on account of the difference between the simulated aerial image and the original structure pattern arrangement.

2. The so-called rule-based OPC, in which the local geometry of line and column structures, which may be obtained from measurements, for example, is used to estimate the local conditions along the edges or outer sides of structure elements. In this case, the structure width measurements or the spacings in the columns between structure elements are entered into a table as indices, which are then assigned bias values (rules). The lengths or widths of serifs which are currently to be added or subtracted can be determined on the basis of a comparison of the current, local configuration with the values entered in the table.

The present invention can be applied to both types of OPC corrections.

The length of a serif is also referred to as run length. A prescribed minimum run length determines a lower limit value for the length of a serif, which must not be undershot during the OPC correction. According to the invention, this value is reduced locally in the identified partial area. The resolution is thus increased, so that edged, angular structure elements can be produced, which can precisely follow the geometrical requirements for a structure pattern which compensates for the proximity effect.

The widths or depth of added or subtracted serifs may also be influenced, in particular, by variation of the grid size of the coordinate grid respectively under consideration within or outside the identified partial area. The parameter which is currently varied in order to increase the resolution within the partial area depends on the software currently being used. The minimum grid size or minimum length of the serifs (minimum run length) represent only two examples for a resolution-identifying parameter of OPC structures (serifs) employed.

BRIEF DESCRIPTION OF THE FIGS

The invention will now be explained in more detail using an exemplary embodiment with the aid of a drawing, in which:

FIG. 1 shows an exemplary embodiment of electronically stored structure elements in each case of a first and second structure pattern, the OPC method according to the invention having been applied to the structure elements of the first structure pattern, and FIG. 2 shows a diagrammatic sketch in which the formation of serifs as OPC structures is added to a structure element, or subtracted.

DETAILED DESCRIPTION

An exemplary embodiment of the method according to the invention for carrying out an OPC correction is illustrated in FIG. 1. The figure shows a segment of two planes, arranged one above the other, from an electronically stored circuit layout 50. In the example, the electronically stored circuit layout 50 is present in the format as a GDS II file and firstly comprises the forms of the structure elements in the structure patterns of the individual planes which are to be achieved on the substrate. In other words, structure elements are to be formed on the substrate by the lithographic projection in the way that they are represented in the circuit layout.

The two planes shown in FIG. 1 represent a first structure pattern 200 for forming gate terminals for selection transistors and also a second structure pattern 100 for forming active regions. The first structure pattern 200 comprises a first interconnect 2a and a second interconnect 2b as structure elements which are to be formed on the substrate but here are still present in only an electronic stored form. The second structure pattern 100 comprises an active region 1 as a structure element.

On the substrate, the plane of the first structure pattern 200 is to be arranged on the plane of the second structure pattern 100. The overlap areas of the structure elements 2a, 2b on the structure element 1 are to be reproduced critically accurately by the lithographic process that is to be carried out later. The active region 1 is additionally surrounded by an isolation region 3. The overlap area between the latter and the interconnects 2a, 2b does not have to be reproduced critically accurately on the substrate.

A partial area 70 is determined or defined on the basic area of the circuit layout, on which elevated requirements are made of reproduced lengths and/or widths of the structure elements 2a, 2b on the substrate. In the exemplary embodiment, the structure elements 1, as active regions to be formed on the substrate, are therefore determined with respect to such partial areas 70. The isolation regions to be formed on the substrate lie outside the partial area 70 in the electronically stored layout.

In order to compensate for the optical proximity effect during the projection from a mask onto the substrate, before the first structure pattern 200 is created on the mask, the OPC correction is carried out in the electronically stored circuit layout 50. For this purpose, a simulation is carried out, for example, which calculates an aerial image produced in the projection plane of the substrate on account of the first structure pattern 200 in the layout 50. In this case, the deviations caused by the proximity effect are iteratively corrected by correction of the first structure pattern 200, and in each case compared with the newly calculated aerial image.

In the data format of the electronically stored circuit layout, corrections are realized by adding serifs 151–155 to the structure elements 2, as is illustrated diagrammatically in FIG. 2. In the exemplary GDS II format, such serifs to be added or added serifs are represented by geometrical basic elements such as squares, rectangles, etc.

For example, a serif 151 having a large length 10c may be added to a segment of an outer side 90 of structure element 2. A line bias would thereby be realized. In order to avoid corner roundings, a serif 152 may be taken into consideration, the lengths 10a and 10b of which are considerably shorter than the length 10c of the first-mentioned serif and which is placed precisely onto the corner rounded by the proximity effect. A larger resolution is achieved in this case.

The structure elements and also the serifs are reproduced in the electronically stored circuit layout by positions in a coordinate grid in an absolute manner or in a relative manner with respect to a hierarchically superordinate element. The coordinate grid has a minimum grid size. Positions lined between two adjacent grid lines cannot be occupied by the structure elements or the edges, sides or corners thereof. The minimum grid size thus describes the resolution in the circuit layout.

During the iteration serifs 151–155 are added to, or taken away from, the structure elements 2a, 2b in the data in accordance with the requirements obtained from the difference between aerial image and data original. In order to keep down the data volume, a lower limit value 21 is prescribed for the lengths 10 of the serifs in the circuit layout. This is because the number of serifs that can be added for correction purposes or the combination of lengths and widths of serifs decreases as a result. The smallest length or width that can be set in theory for a serif 155–155 is precisely the grid size of the coordinate grid. However, the lower limit value 21 is generally somewhat higher.

A characteristic step is then performed by identifying a segment of the outer side of the structure element 2a, 2b, whose position lies within the defined partial area 70. For a serif 10", for example, which is added to said segment, the condition that the serif length be greater than the lower limit value 21 is now cancelled on account of this ascertained property of lying within the partial area 70. A further lower limit value 20 is defined, which, however, is less than the first lower limit value 21.

As can be seen in FIG. 1, after the correction by further serifs having lengths 10', 10''', 10'''', 10''''', etc., the form of the outer sides of the structure elements 5 produced from the original structure elements 2a, 2b becomes finer, provided that they are situated within the partial area 70. They follow a curve-shaped, ideal line profile (not shown in FIG. 1) more precisely than is the case for instance for the corrected outer sides outside the partial area 70.

In accordance with a further exemplary embodiment of the present invention, the minimum grid size of the coordinate grid lines is reduced within the partial area 70 in the electronically stored circuit layout. The lower limit value thus decreases for the serifs to be added within the partial area 70. The lower limit value here is equal to the minimum grid size. In this example, therefore, a conversion is accordingly already achieved at the data level in the electronically stored circuit layout, here a GDSII file.

In the next step, the circuit layout data are converted, for example, into writer data for instance, for an electron beam mask writer. The writer generates a mask which has the first structure pattern 200 in OPC-corrected form. The structure pattern is subsequently transferred from the mask to the substrate in a lithographic projection step.

List of Reference Symbols
1 Selected structure element, active region
2a, 2b Structure element, Interconnect
3 Isolation region, STI
10 Length of the serifs
20 Lower limit value within partial area
21 Lower limit value outside partial area
50 Electronically stored circuit layout, GDSII
70 Partial area
90 Outer side of the structure element
100 Second structure pattern
155–155 Serifs
200 First structure pattern

What is claimed is:

1. A method for exposing a substrate with correction of the optical proximity effect, comprising:
providing a circuit layout representing an integrated circuit to be formed on the substrate;
creating a first and at least one second structure pattern in the circuit layout, which in each case have an assignment of structure elements to positions within a common idealized basic area;
electronically storing the first and at least the second structure pattern in a data format;
prescribing a lower limit value for a length of a serif, the serif to be added to a segment of an outer side of one of the structure elements in the electronically stored first structure pattern to compensate for the optical proximity effect;
defining a partial area of the idealized basic area, the idealized basic area including at least one selected structure element of the second structure pattern (100) stored electronically in the data format;
selecting a segment of an outer side of at least one first structure element of the first structure pattern stored electronically in the data format, the segment having a position within the idealized basic area;
comparing the position of the segment in the electronically stored first structure pattern with the partial area;
determining a length of a serif dependent on the comparison result so that the length is less than the lower limit value;
adding the serif to the segment of the outer side of the first structure element in the data format to form a first structure pattern which compensates for the optical proximity effect;
exposing a mask with the compensated first structure pattern; and transferring and exposing the first structure pattern from the mask to the substrate with correction of the optical proximity effect.

2. The method as claimed in claim 1, wherein adding the serif to the segment of the outer side of the first structure element is preceded by:
 determining an image of the first structure pattern stored electronically in the data format, the image being produced in the case of exposure under the influence of the optical proximity effect on the substrate;
 comparing the image with the first structure pattern to be formed, which is stored electronically in the data format; and
 determining the length of the serif to be added dependent on the result of the comparison.

3. The method as claimed in claim 1, wherein the compensated first structure pattern transferred to the substrate after exposing the mask and the substrate and, in the case of a further exposure, the second structure pattern transferred to the substrate represent electrically conductive structure elements in each case in different planes of the integrated circuit.

4. The method as claimed in claim 1, wherein the first structure element of the first structure pattern, which is transferred to the substrate, represents an interconnect for connecting a number of transistors, the selected second structure element of the second structure pattern to be formed on the substrate represents an active region in which the transistor is to be fabricated.

5. The method as claimed in claim 1, a further lower limit value is prescribed for the length of the serif, the serif being added to the electronically stored first structure element within the partial area to compensate for the optical proximity effect, which the further lower limit value is less than the prescribed first lower limit value.

6. The method as claimed in claim 5, wherein the first and the second structure pattern are stored electronically in a data format, in which the position of the structure elements is specified at grid points in a first coordinate grid having a first grid size between adjacent grid lines, the prescribed lower limit value is equal to the first grid size, the definition of the partial area is followed by the setting up of a second coordinate grid having a second grid size, which is reduced compared with the first grid size, within the partial area, the prescribed lower limit value is equal to the second, reduced grid size.

* * * * *

UNITED STATES PATENT AND TRADEMARK OFFICE
CERTIFICATE OF CORRECTION

PATENT NO. : 7,157,194 B2 Page 1 of 1
APPLICATION NO. : 10/771302
DATED : January 2, 2007
INVENTOR(S) : Uwe Paul Schroeder It is certified that error appears in the above-identified patent and that said Letters Patent is hereby corrected as shown below:

Col. 2, line 43:    Replace "arid" with -- and --

Col. 5, line 51:    Replace "155-155" with -- 151-155 --

Col. 6, line 31:    Replace "155-155" with -- 151-155 --

Signed and Sealed this

Thirteenth Day of November, 2007

JON W. DUDAS
*Director of the United States Patent and Trademark Office*